United States Patent [19]
Wuidart

[11] Patent Number: 5,778,037
[45] Date of Patent: Jul. 7, 1998

[54] METHOD FOR THE RESETTING OF A SHIFT REGISTER AND ASSOCIATED REGISTER

[75] Inventor: Sylvie Wuidart, Pourrières, France

[73] Assignee: SGS-Thomson Microelectronics S.A., Saint Genis, France

[21] Appl. No.: 732,601

[22] Filed: Oct. 16, 1996

[30] Foreign Application Priority Data

Oct. 16, 1995 [FR] France .................. 95 12104

[51] Int. Cl.[6] .................................................. G06M 3/00
[52] U.S. Cl. .................. 377/26; 377/54; 377/67; 377/78; 377/81
[58] Field of Search ................. 377/78, 26, 54, 377/67, 81; 365/189.12, 78

[56] References Cited

U.S. PATENT DOCUMENTS 5,202,908  4/1993  Hatada .................. 377/64

FOREIGN PATENT DOCUMENTS

| A-0 138 406 | 4/1985 | European Pat. Off. ........ G11C 19/28 |
| A-0 224 004 | 6/1987 | European Pat. Off. ........ G11C 19/00 |
| 0236498 | 9/1989 | Japan ........................... 377/78 |

*Primary Examiner*—Margaret Rose Wambach
*Attorney, Agent, or Firm*—Wolf, Greenfield & Sacks, P.C.

[57] ABSTRACT

A method for the resetting of a group of series-connected non-transparent synchronous memory cells. The method includes modifying the clock signals that control the transfer gates of these cells on the activation of a resetting signal to set all the transfer gates in the on state. The method is particularly suited to the resetting of long shift registers such as those used in cryptographic applications, especially in micro-circuit cards, and the reset circuitry can be implemented using conventional logic gates.

32 Claims, 1 Drawing Sheet

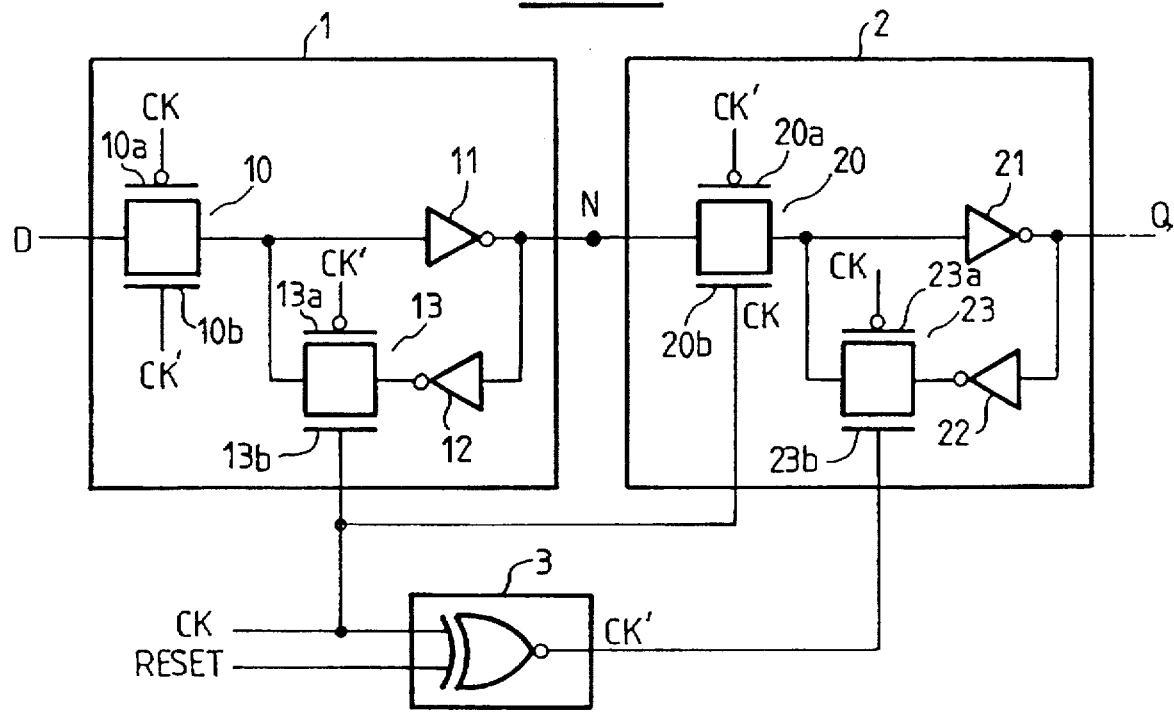
FIG_1
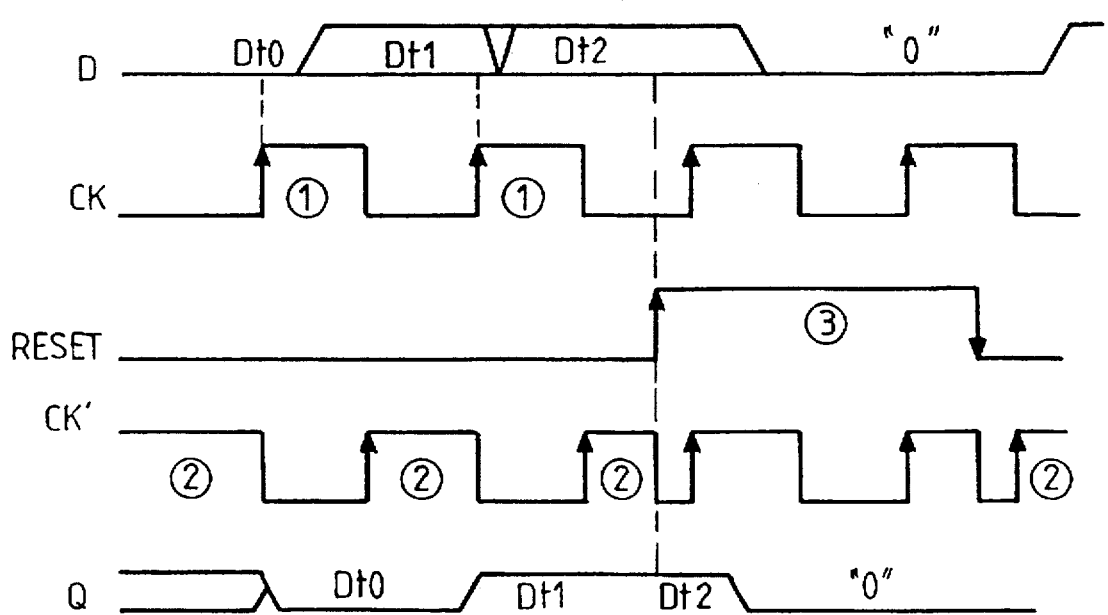
FIG_2

METHOD FOR THE RESETTING OF A SHIFT REGISTER AND ASSOCIATED REGISTER

BACKGROUND OF THE INVENTION

1. Field of the Invention

The present invention relates to the resetting of a group of synchronous and nontransparent memory cells that are series-connected. More particularly, the present invention relates to the resetting of long shift registers, such as those used in cryptographic applications, especially in microcircuit-based cards.

2. Discussion of the Related Art

A non-transparent synchronous cell of a shift register usually has an input stage and an output stage, controlled by means of two clock signals in phase opposition. These clock signals are applied to transfer gates for the transfer of the data elements of each stage. One of the two clock signals activates the holding of a data element in the input stage and its transfer to the output stage. The other clock signal activates the input of a new data element in the input stage and the holding of a previous data element in the output stage.

A shift register is usually reset by the introduction, into each cell, of a circuit capable of imposing a zero at an input when a resetting signal is activated. This circuit generally uses logic gates in synchronization with the control signals for the register. In practice, at least one to two additional transistors must be planned in the input stage and the output stage of each cell to carry out this resetting function. Thus, the resetting circuit soon becomes bulky beyond a certain length of register. For example, in a register with 1024 cells, at least 4096 additional transistors are needed.

Another disadvantage of typical reset circuits is that the synchronizing of the resetting signal with the control signals for the register introduces a delay in the performance of the resetting. Furthermore, this resetting circuit necessitates the conveyance of the signal up to each cell. Beyond a certain length of register, the loss of time that can be attributed to the time of propagation of the active state of the resetting signal to each cell is no longer negligible.

Therefore, it is important, for certain applications of shift registers, to be able to reset their contents almost instantaneously so as not to "expose" the sensitive data contained therein. This is particularly true in the case of cryptographic applications and also for shift registers that work at higher speed.

SUMMARY OF THE INVENTION

It is an object of the present invention to provide a method of resetting that enables an almost instantaneous resetting of the shift register. Another object of the present invention is to provide a circuit for the resetting of a highly compact shift register. A further object of the present invention is a resetting circuit that enables a non-synchronous resetting of the operation of the shift register, thus enabling this resetting to be carried out immediately, without delay.

An embodiment of the invention is directed to a method for the resetting of a group of series-connected non-transparent synchronous memory cells, including transfer gates controlled by at least two clock signals, in phase opposition, to turn certain of these gates off and turn the other gates on and vice versa. According to this embodiment, the method includes the modification of these clock signals upon the activation of a resetting signal to set all the transfer gates in the on state.

A second embodiment of the invention is directed to a shift register comprising seriesconnected non-transparent synchronous memory cells, controlled by at least two clock signals in phase opposition, said cells including transfer gates each receiving at least one of the two clock signals to be turned off or turned on depending on whether a new data element is memorized in each cell or whether a memorized data element is transferred to the output of each cell. According to this embodiment, the register includes a resetting circuit to make all the cells of said register transparent in a resetting phase, said circuit including at least one logic gate to modify the two clock signals during the active state of a resetting signal.

BRIEF DESCRIPTION OF THE DRAWINGS

Other advantages and characteristics of the invention shall be described in detail in the following description given by way of example with reference to the accompanying drawings, in which:

FIG. 1 shows an exemplary structure of a cell of a shift register with a resetting circuit according to an embodiment of the invention; and FIG. 2 is a timing diagram of the circuit of FIG. 1, showing signals that illustrate normal operation and the resetting phase.

DETAILED DESCRIPTION

FIG. 1 exemplifies a structure of a shift register given purely by way of a non-exhaustive example in order to illustrate the invention.

A synchronous and non-transparent cell of a shift register usually has an input stage 1 and an output stage 2 controlled by at least two clock signals CK and CK' in phase opposition (CK'=/CK). The input stage has one input D and one output node N connected to the input of the output stage. The output of the output stage is referenced Q. These two stages have transfer gates 10, 13, 20, 23 controlled by the two clock signals.

The principle of operation as illustrated in FIG. 2 can be explained as follows:

Phase (1): when the first clock signal CK is active (CK=1), the input stage is insulated from its input D and transmits the previously memorized data element $Dt_0$, on the node N. The output stage transmits this data element on its output Q.

Phase (2): when it is the other clock signal that is active (CK'=1), the input stage memorizes the new data element $Dt_1$, present at its input D, while the output stage is insulated from the node N and holds the data element $Dt_0$ at its output Q.

According to an embodiment of the invention, there is provided a resetting circuit to modify the clock signals CK and CK' during the active state of a resetting signal so as to set the two stages in a transparent mode in order to reset the cell instantaneously with a resetting data element.

In practice, by presenting the resetting data element at the input D of the first cell of a register and then activating the reset signal referenced reset, the resetting circuit sets the two clock signals applied to all the cells in a modified state, so that all the transfer gates of all the cells are on: the cells of the register are then in transparent mode and get reset very soon.

The reset signal no longer has to be propagated: it modifies the clock signals of the register to modify its operation. The resetting time then corresponds essentially to the time taken to transfer the data in a single-phase operating mode of the register (since all the input and output stages are in transfer mode).

In the example shown in FIG. 1, the input stage 1 has a first transfer gate 10 connected to the input D of the cell. The transfer gate 10 is followed by a first inverter 11 whose output forms the output node N of the input stage. The output of the inverter 11 is looped to its input by a second inverter 12 that is series-connected with a second transfer gate 13. The assembly formed by the two inverters and the transfer gate forms a storage loop, with a first inverter 11 having low resistivity (strong) and a second highly resistive inverter 12.

The output stage 2 has a similar structure. The input of the output stage 2 is connected to the node N and transmits the data elements at its output Q. The first transfer gate, the first inverter, the second inverter and the second transfer gate of this output stage are respectively referenced: 20, 21, 22 and 23.

In the example shown, the transfer gates are dual-command gates. They have two parallelconnected MOS transistors with opposite types of conductivity. The transfer gate 10 thus has a P type MOS transistor referenced 10a and an N type MOS transistor referenced 10b. In operational mode, the two transistors of a transfer gate are controlled in phase opposition to be on at the same time and insulating at the same time. Thus, in the example, the transfer gates 10 and 23 receive the clock signal CK at the gate of their P type transistor (10a and 23a) and the clock signal CK' at the gate of their N type transistor (10b and 23b). In this way, these gates are off during the phase (1) for the transfer of the stored data element Dto to the Q output of the output stage. They are on during the phase (2) for the storage of a new data element Dt1 presented at the D input.

The transfer gates 13 and 20 for their part receive the clock signal CK' at the gate of their P type transistor (13a and 20a) and the clock signal CK at the gate of their N type transistor (13b and 20b). In this way, these gates are on during the transfer phase (1) and off during the storage phase (2). The transfer gates 10 and 23 therefore work in reverse to the transfer gates 13 and 20.

According to an embodiment of the invention, it is provided that the activation of a reset signal (reset=1) will modify the two clock signals CK and CK' to set all the transfer gates in the on state: a data element present at input is transmitted directly to the Q output through the gate 10, the inverter 11, the gate 20 and the inverter 21. In the example, it is enough for this purpose to place the clock signals CK and CK' in phase (CK=CK' when reset=1). Indeed, since the transfer gates herein comprise two transistors with opposite types of conductivity, there will always be one that is on: the P type transistor when CK=CK'=0 and the N type transistor when CK=CK'=1.

If the transfer gates were to have only one transistor, it would be necessary, to implement the invention, to set the clock signals CK and CK' in an appropriate state (0 or 1) during the resetting time to turn all the transfer gates on. In practice, to modify the clock signals CK and CK' according to the invention, in order to turn on all the transfer gates of the cells of the register, it is sufficient to use one or more logic gates as a resetting circuit 3.

In the example shown in FIG. 1 where, in order to obtain operation in transparent mode according to the resetting method of the invention, it is necessary to have clock signals CK and CK' in phase during the resetting, and in phase opposition otherwise, it is enough to have a single Exclusive NOR gate as the resetting circuit 3. This gate receives the resetting signal, RESET, and a clock signal (for example CK) as inputs, and delivers the other clock signal (in the example CK') at output. The clock signal used to generate the other is obtained conventionally from a clock signal generating circuit (comprising an oscillator and a divider) that is not shown.

Clearly, changes may be made to the circuit as described and illustrated herein without, however, departing from the scope of the present invention. In particular, the present invention can be applied to all the various shift register structures that set the transfer gates in the on state by modifying the clock signals that control them.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A shift register comprising:

a plurality of series-connected, non-transparent synchronous memory cells, each memory cell of the plurality of memory cells being controlled by a first clock signal and a second clock signal that is in phase opposition to the first clock signal, each memory cell having a plurality of transfer gates, each transfer gate of the plurality of transfer gates receiving at least one of the first and second clock signals to turn certain transfer gates of the plurality of transfer gates in each memory cell off and to turn remaining transfer gates of the plurality of transfer gates in each memory cell on dependent upon one of whether a new data element is to be memorized by each cell and whether a memorized data element is to be transferred to a next memory cell in the series; and a reset circuit coupled to each memory cell of the plurality of series-connected, non-transparent synchronous memory cells to make all of the plurality of series-connected, non-transparent synchronous memory cells transparent during a resetting phase, the reset circuit including at least one logic gate that receives a reset signal and modifies the second clock signal during an active state of the reset signal.

2. The shift register of claim 1, wherein:

each transfer gate of the plurality of transfer gates of each memory cell includes at least two transistors, a first of the at least two transistors being controlled by the first clock signal, and a second of the at least two transistors being controlled by the second clock signal; and the reset circuit includes an exclusive NOR gate having a first input that receives the first clock signal, a second input that receives the reset signal, and an output that provides the second clock signal in phase with the first clock signal during the active state of the reset signal and in phase opposition to the first clock signal during an inactive state of the reset signal.

3. The shift register of claim 1, wherein the shift register is formed in an integrated circuit.

4. The shift register of claim 3, wherein the integrated circuit is provided on microcircuit-based card.

5. A control circuit for a shift register having a plurality of series-connected memory cells, each of the plurality of series-connected memory cells having an input stage coupled to an output stage, the input and output stages of each of the plurality of memory cells having a first state and a second state, the first state reading data, and the second state holding the data, the control circuit comprising:

a first input, coupled to the input and output stages of each of the plurality of series-connected memory cells, to receive a first signal, the first signal setting the input stage of each of the plurality of series-connected memory cells to the first state and the output stage of each of the plurality of series-connected memory cells to the second state when the first signal is asserted, and setting the input stage of each of the plurality of series-connected memory cells to the second state and the output stage of each of the plurality of series-connected memory cells to the first state when the first signal is not asserted;

a second input to receive a control signal; and an output, coupled to the input and output stages of each of the plurality of series-connected memory cells, to provide a second signal to the input and output stages of each of the plurality of series-connected memory cells setting each of the plurality of series-connected memory cells to the first state when the control signal is asserted.

6. The control circuit of claim 5, wherein the second signal is in phase opposition to the first signal when the control signal is deasserted, and the second signal is in phase with the first signal when the control signal is asserted.

7. The control circuit of claim 5, further comprising:

an exclusive NOR gate, having a first input, a second input and an output, the first input being coupled to the first input of the control circuit, the second input being coupled to the second input of the control circuit, and the output being coupled to the output of the control circuit.

8. The control circuit of claim 7, wherein the shift register and the control circuit are formed in a single integrated circuit that is provided on a microcircuit-based card used in cryptographic applications.

9. A shift register comprising:

a plurality of series-connected memory cells, each of the plurality of series-connected memory cells having an input stage coupled to an output stage, the input stage and the output stage of each of the plurality of series-connected memory cells having a reading state and a holding state, the input stage reading data in the reading state and holding the data as held data in the holding state, the output stage reading the held data in the reading state and holding the held data in the holding state; and a control circuit, coupled to the input stage and the output stage of each of the plurality of series-connected memory cells, to receive a control signal and provide at least one of a first signal and a second signal to the input stage and the output stage of each of the plurality of series-connected memory cells, the at least one of the first and second signals setting the input stage and the output stage of each memory cell to opposite states when the control signal is deasserted and to the reading state when the control signal is asserted.

10. The shift register of claim 9, wherein the second signal is in phase opposition to the first signal when the control signal is deasserted, and the second signal is in phase with the first signal when the control signal is asserted.

11. The shift register of claim 9, wherein the control circuit includes an exclusive NOR gate, having a first input, a second input and an output, the first input being coupled to the first input of the control circuit, the second input being coupled to the second input of the control circuit, and the output being coupled to the output of the control circuit.

12. The shift register of claim 9, wherein each input stage includes:

a first transfer gate having an input to receive the data and an output; and a first storage loop coupled to the output of the first transfer gate to hold the held data.

13. The shift register of claim 12, wherein each output stage includes:

a second transfer gate having an input to receive the held data and an output; and a second storage loop coupled to the output of the second transfer gate to hold and output the held data.

14. The shift register of claim 13, wherein:

the first storage loop includes a third transfer gate and first and second inverters, each having an input and an output, the input of the first inverter being coupled to the output of the first transfer gate and the output of the third transfer gate, the output of the first inverter being coupled to the input of the second transfer gate and the input of the second inverter, and the output of the second inverter being coupled to the input of the third transfer gate; and the second storage loop includes a fourth transfer gate and third and fourth inverters, each having an input and an output, the input of the third inverter being coupled to the output of the second transfer gate and the output of the fourth transfer gate, the output of the third inverter outputting the held data and being coupled to the input of the fourth inverter, and the output of the fourth inverter being coupled to the input of the fourth transfer gate.

15. The shift register of claim 14, wherein the second and fourth inverters have a higher resistivity than the first and third inverters, respectively.

16. The shift register of claim 9, wherein each input stage includes:

a first transfer gate having an input to receive the data and an output; and a second transfer gate coupled to the output of the first transfer gate;

wherein the first transfer gate is on and the second transfer gate is off when the input stage is in the reading state and the first transfer gate is off and the second transfer gate is on when the input stage is in the holding state.

17. The shift register of claim 16, wherein each output stage includes:

a third transfer gate having an input to receive the held data and an output; and a fourth transfer gate coupled to the output of the third transfer gate;

wherein the third transfer gate is on and the fourth transfer gate is off when the output stage is in the reading state and the third transfer gate is off and the fourth transfer gate is on when the output stage is in the holding state.

18. The shift register of claim 17, wherein the first, second, third, and fourth transfer gates of each of the plurality of series-connected memory cells are on when the control signal is asserted.

19. The shift register of claim 17, wherein the first and third transfer gates of each of the plurality of series-connected memory cells each include at least two transistors, a first transistor of the at least two transistors receiving the first signal and a second transistor of the at least two resistors receiving the second signal, the first and second transistors of the first and third transfer gates being on in the reading state and off in the holding state when the control signal is deasserted, and one of the first transistor and the second transistor of the first and third transfer gates being on when the control signal is asserted.

20. The shift register of claim 17, wherein:

the second signal is in phase opposition to the first signal when the control signal is deasserted and the second signal is in phase with the first signal when the control signal is asserted; and the control circuit includes an exclusive NOR gate, having a first input, a second input and an output, the first input being coupled to the first input of the control circuit, the second input being coupled to the second input of the control circuit, and the output being coupled to the output of the control circuit.

21. A method for resetting a shift register having a plurality of series-connected non-transparent memory cells, each memory cell of the plurality of memory cells receiving a first signal and a second signal and having an input stage that is coupled to an output stage, the output stage of a first memory cell in the series being coupled to the input stage of a next memory cell in the series, one of the input stage and the output stage of each memory cell being transparent when the first signal and the second signal have a first phase relationship, the method comprising the steps of:

receiving a third signal; and modifying the second signal, responsive to the third signal, to have a second phase relationship to the first signal that is different than the first phase relationship so that the input and output stages of each memory cell are simultaneously transparent.

22. The method of claim 21, wherein the first signal is out of phase with the second signal when the first and second signals have the first phase relationship, and wherein the first signal is in phase with the second signal when the first and second signals have the second phase relationship.

23. The method of claim 22, further comprising steps of:

receiving the first signal on a first input of a reset circuit;

receiving the third signal on a second input of the reset circuit; and combining the first signal and the third signal to generate the second signal, the second signal having the first phase relationship to the first signal when the third signal has a first value and having the second phase relationship to the first signal when the third signal has a second value.

24. The method of claim 23, wherein the step of combining includes a step of exclusively NORing the first signal and the third signal to generate the second signal.

25. The method of claim 23, wherein the shift register stores a digital value, the method further comprising a step of:

providing a reset value to the first memory cell in the series to replace the digital value stored in the shift register.

26. The method of claim 21, wherein the first signal is in phase opposition to the second signal, and wherein the step of modifying the second signal includes a step of synchronizing the second signal to the first signal so that the first and second signal are in phase.

27. A shift register comprising:

a plurality of series-connected non-transparent memory cells, each of the plurality of series-connected non-transparent memory cells receiving a first signal and a second signal and having an input stage that is coupled to an output stage, the output stage of a first memory cell in the series being coupled to the input stage of a next memory cell in the series, only one of the input stage and the output stage of each memory cell in the series being transparent when the first signal and the second signal have a first phase relationship; and means, coupled to each of the plurality of memory cells and responsive to a control signal, for modifying the first phase relationship so that both the input stage and the output stage of each memory cell in the series are transparent.

28. The shift register of claim 27, wherein the first signal is out of phase with the second signal when the first signal and the second signal have the first phase relationship, and the means for modifying the first phase relationship modifies the second signal in response to the control signal so that the second signal is in phase with the first signal.

29. The shift register of claim 28, wherein the means for modifying includes a logic circuit having a first input, a second input, and an output, the first input receiving the first signal, the second input receiving the control signal, and the output providing the second signal to each of the plurality of series-connected memory cells.

30. The shift register of claim 29, wherein the logic circuit includes an exclusive NOR gate having a first input, a second input and an output, the first input being coupled to the first input of the logic circuit, the second input being coupled to the second input of the logic circuit, and the output being coupled to the output of the logic circuit.

31. The shift register of claim 27, wherein:

a same one of the input stage and the output stage of each memory cell in the series is transparent when the first signal and the second signal have the first phase relationship.

32. The shift register of claim 31, wherein the first signal is out of phase with the second signal when the first signal and second signal have the first phase relationship and the means for modifying the first phase relationship synchronizes the second signal to the first signal so that the second signal is in phase with the first signal.

* * * * *